Figure 1:
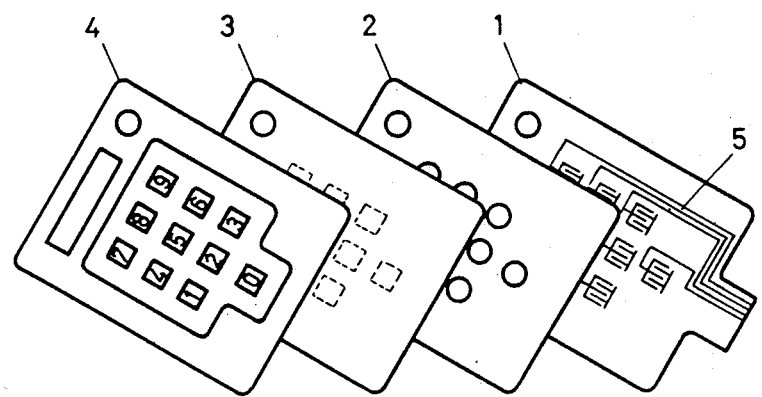

United States Patent [19]
Böck

[11] Patent Number: 4,927,479
[45] Date of Patent: May 22, 1990

[54] PROCESS AND PLANT FOR PRESSING FLEXIBLE SHEETS

[76] Inventor: Josef Böck, Steigrüebli, CH-9400 Rorschacherberg, Switzerland

[21] Appl. No.: 318,413

[22] Filed: Feb. 28, 1989

Related U.S. Application Data

[63] Continuation of Ser. No. 758,629, Jul. 2, 1985, abandoned.

[30] Foreign Application Priority Data

Nov. 2, 1983 [CH] Switzerland ............... 5926/83

[51] Int. Cl.⁵ .............. B29D 9/00; H01H 11/00; B32B 31/04
[52] U.S. Cl. ..................... 156/228; 156/233; 156/235; 156/239; 156/241; 156/497; 156/538; 156/580; 156/583.1
[58] Field of Search .......... 100/93 P, 280; 156/230, 156/233, 234, 235, 239, 241, 87, 541, 542, 556, 557, 563, 574, 539, 538, 497, 228, 580, 583.1; 248/363; 221/210

[56] References Cited

U.S. PATENT DOCUMENTS

| | | | |
|---|---|---|---|
| 1,891,931 | 12/1932 | Hornig | 156/539 |
| 2,596,253 | 5/1952 | Kurkjian | 156/539 |
| 3,204,817 | 9/1965 | Kostering | 221/210 |
| 3,873,395 | 3/1975 | Ehrlich | 156/382 |
| 3,962,026 | 6/1976 | Lottridge | 156/584 |
| 4,234,373 | 11/1980 | Reavill et al. | 156/580 X |
| 4,273,738 | 6/1981 | Spengler | 100/280 X |
| 4,317,011 | 12/1982 | Mazurk . | |
| 4,407,692 | 10/1983 | Torbeck | 156/541 X |
| 4,505,771 | 3/1985 | George | 156/563 X |
| 4,541,886 | 9/1985 | Marlow et al. | 156/230 |

FOREIGN PATENT DOCUMENTS

| | | |
|---|---|---|
| 2464195 | 3/1981 | France . |
| 517622 | 2/1972 | Switzerland . |
| 2097588 | 10/1981 | United Kingdom . |

OTHER PUBLICATIONS

Mayborg et al., *Method of Forming a Curved Membrane Assembly Having a Concave Top*, 9/84, pp. 1915-1916.

Primary Examiner—Michael W. Ball
Assistant Examiner—Jeff H. Aftergut
Attorney, Agent, or Firm—Blum Kaplan

[57] ABSTRACT

The plant comprises a first vacuum plate with openings on which a sheet may be fixed in an exact planar way by suction. A second plate with a slightly arcuated surface and turned towards the first plate is adjustable in height by two compressing cylinders and is pivotingly fixed to the structure. The second plate is also a vacuum plate and may be unrolled on the first plate. During the unrolling motion, the second plate is conducted by means of retractable bolts which are engaged into corresponding openings of the first plate. To compress two sheets, a first sheet is fixed in an exact planar way to the first plate by suction and transferred by an unrolling motion of the second plate thereon, the suction force of the plate being reduced and that of the second plate being correspondingly increased. A second sheet is then fixed to the first plate and cold- or hot-compressed according to the same unrolling process as the first sheet. The plant is particularly appropriate for fabricating sheets or membrane keyboards.

10 Claims, 6 Drawing Sheets

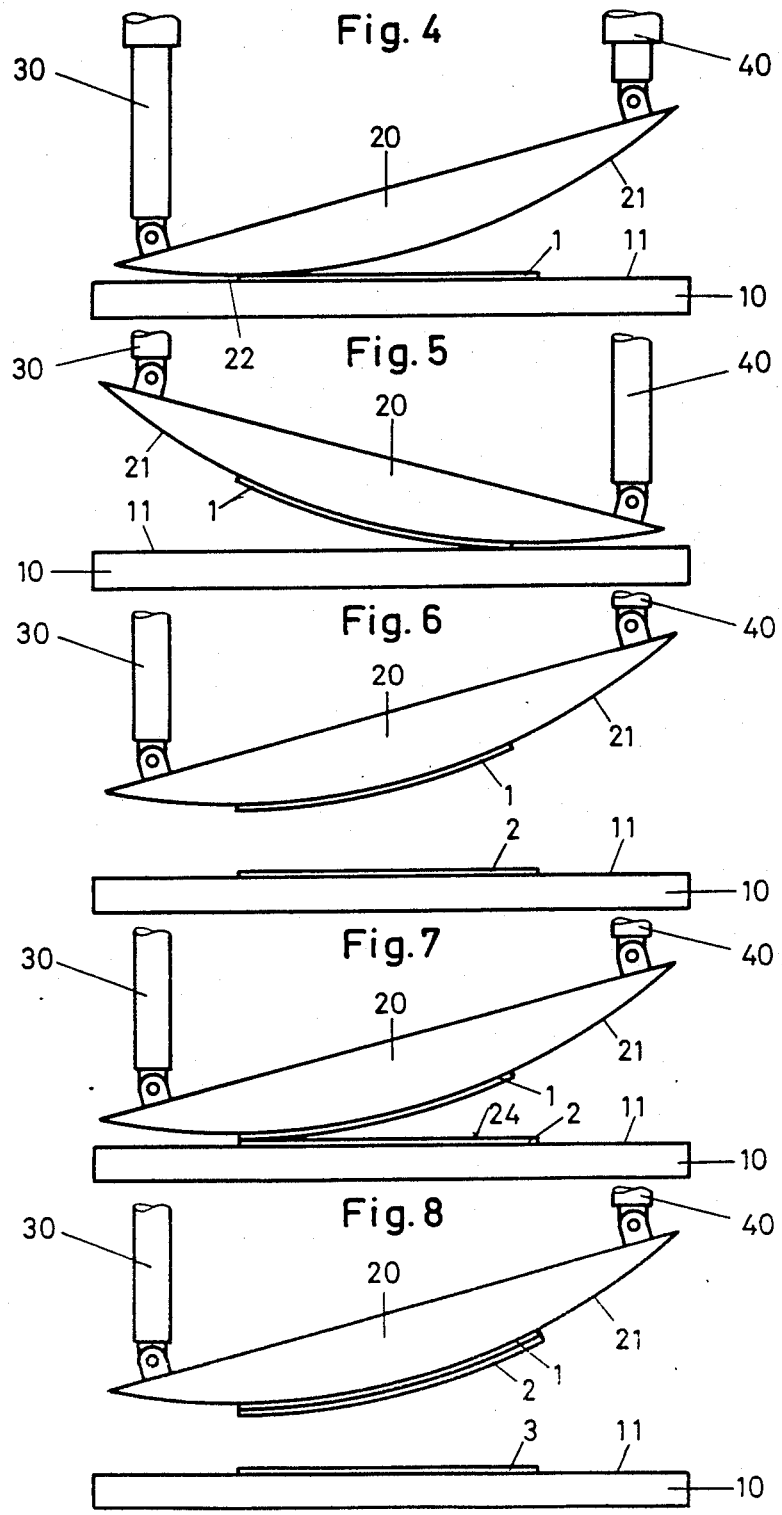

PROCESS AND PLANT FOR PRESSING FLEXIBLE SHEETS

This is a continuation of application Ser. No. 06/758,692, filed July 2, 1985, now abandoned.

The invention relates to a process for the pressure-bonding of flexible foils.

A known process for the pressure-bonding of foils provides that a foil is pressed by hand against a second foil by means of a rubber blade which is pushed under pressure over the foil, whereby at least one foil is provided with an adhesive coating. This causes a high degree of waste since foils are frequently displaced against each other or air bubbles are enclosed between the foils. Because the rubber blades are resilient at the pressure edge, the contact foils are pressed, for instance in the manufacturing of keyboards, at the contact points into the recesses of the spacer foils. To allow the pressed-out air to flow back and the spacer foils to be relieved from tension, connecting channels must be provided between the recesses. These channels interfere, however, with the switching, as the air under the touch domes can escape through the channels during the depression of the keys and, as a result of it, the snapping or clicking action is not distinctly perceived by the sense of touch. If channels in a keyboard are plugged up, the spacer foil cannot release its tension, causing a short circuit.

The invention is based on the task of generating a process by means of which the foils can be pressure-bonded rapidly and in exact position without any enclosure of air. The process shall be suitable to the greatest degree possible for automatic production.

The process according to the invention is characterized by the feature cited in the characterizing part of claim 1.

Additional advantageous process features result from the dependent claims of the process.

The invention pertains also to devices for the execution of the process.

The invention furthermore has the task of creating a device permitting a precise cold and hot-pressing of foils capable of being automated to a wide degree.

The devices pursuant to the invention are characterized by the features cited in the characterizing parts of claim 5.

Additional advantageous forms of construction result from the dependent claims of the device.

The invention also relates to a keyboard manufactured by the process according to the invention.

Figure 2:
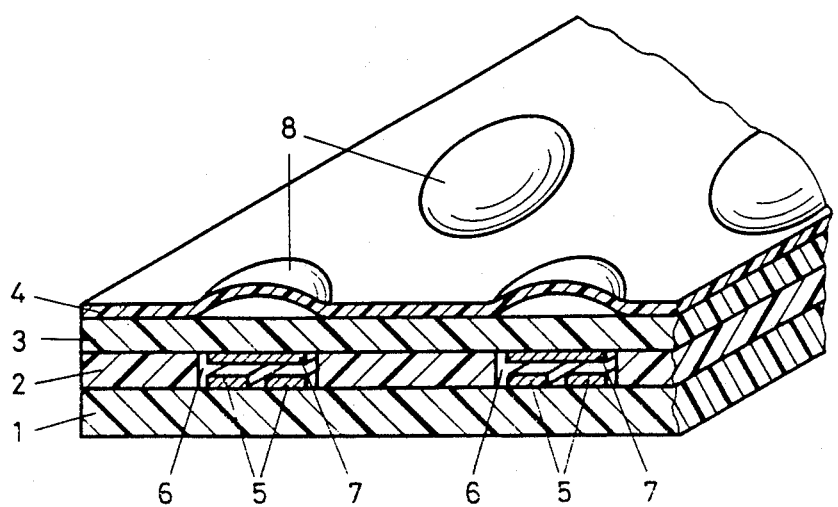
Figure 3:
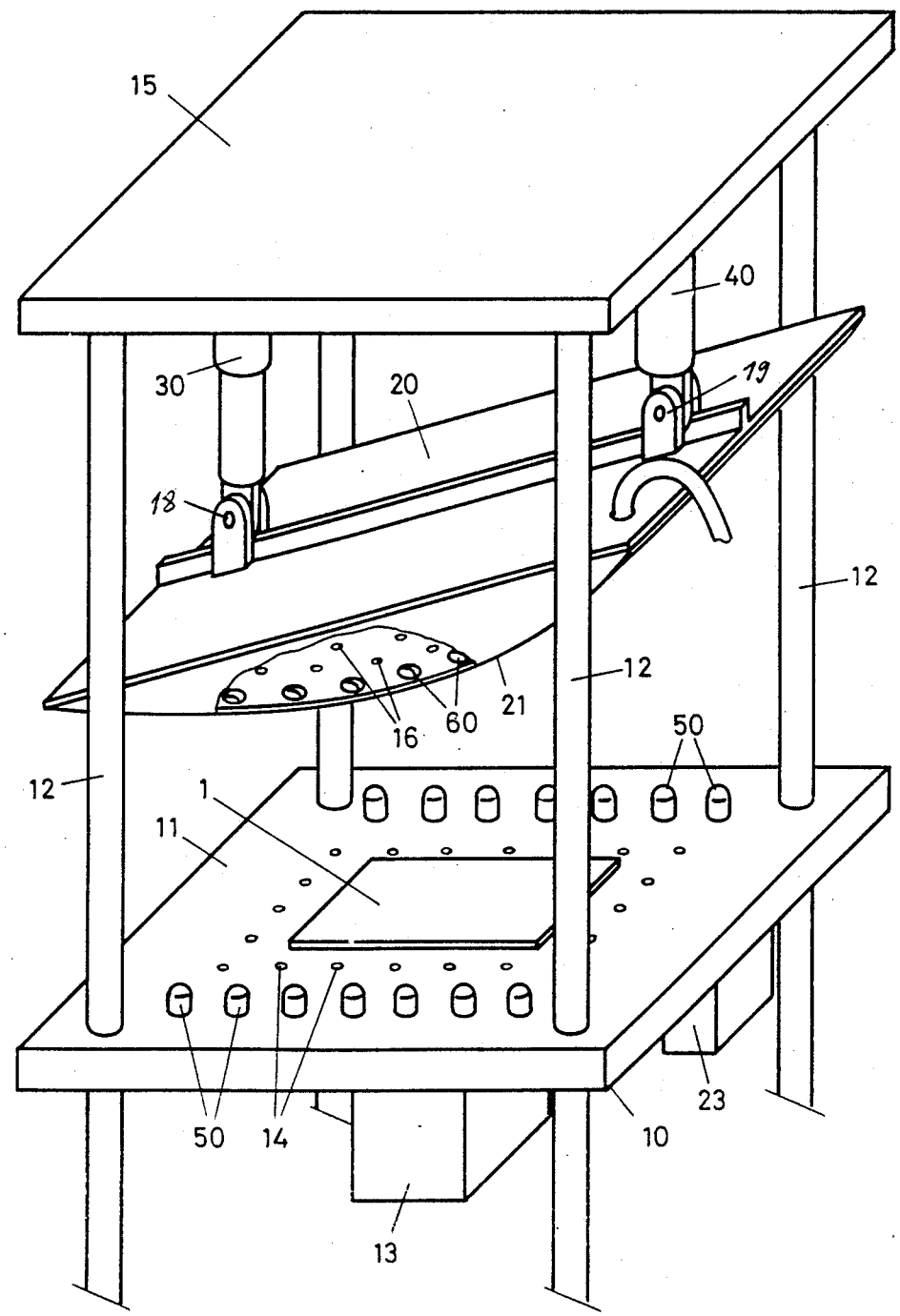
Figure 9:
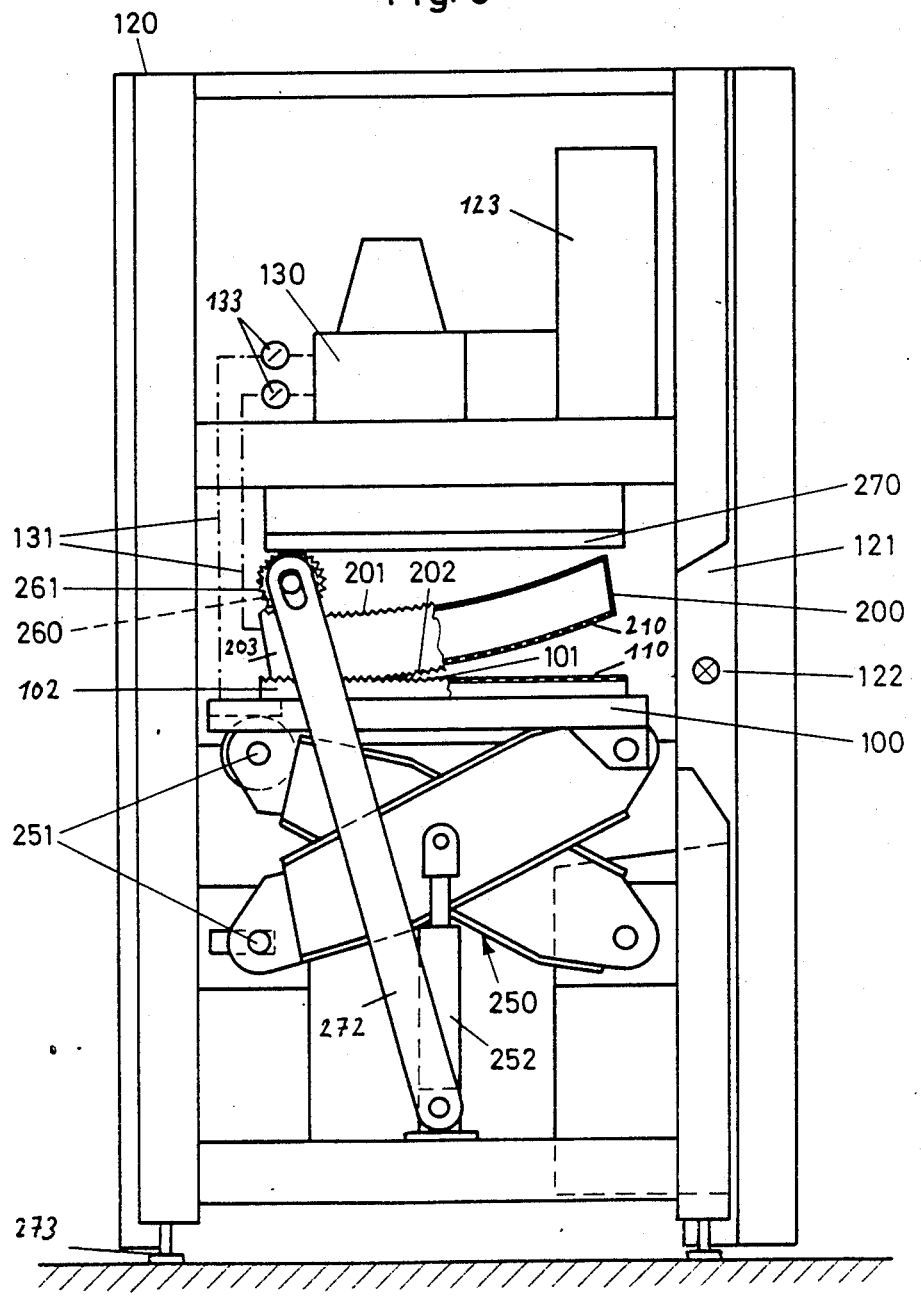
Figure 10:
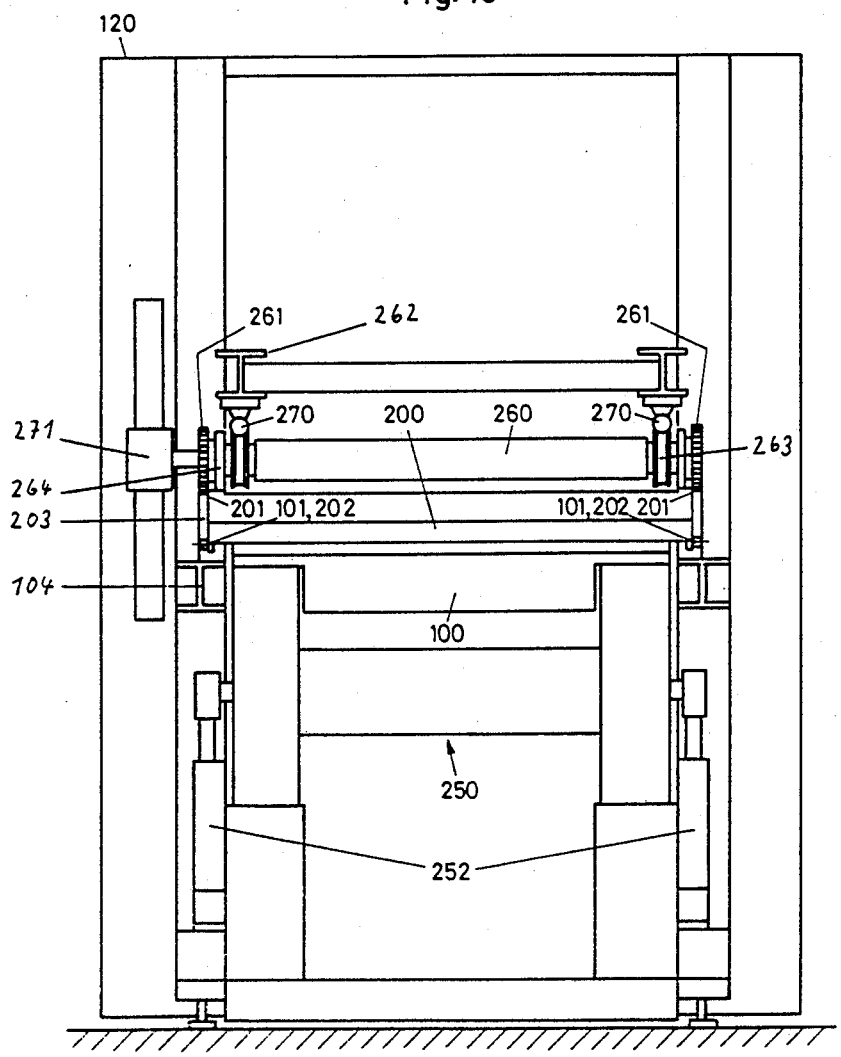

The process, two exemplified embodiments of the device, and a keyboard are explained subsequently in closer detail by means of the drawing which shows in:

FIG. 1 a schematic representation of the construction of a keyboard consisting of four foils, FIG. 2 a cross-section of the keyboard, FIG. 3 a view of a first variant of a device for the pressurebonding of foils, and FIG. 4 to FIG. 8 a diagram of the individual steps of movement during the pressure-bonding of two foils by means of the device pursuant to the first variant, FIG. 9 a lateral view drawn partially in section, of a second variant of a device for the pressure-bonding of foils, whereby some parts have been omitted for better viewing, FIG. 10 a view of the back side of the second variant of the device pursuant to FIG. 9, and FIG. 11a to 11h a diagram of the steps of movement during the pressure-bonding of two foils by means of the device according to the second variant.

FIGS. 1 and 2 show by way of example a keyboard consisting of a base foil 1 with imprinted conducting paths 5, a spacer foil 2 with punched-out openings 6 at the contact points provided, a contact foil 3 with imprinted contact points 7 which establish contact with the base foil 1 when the keys are actuated, as well as a front foil with touch domes 8 indicating the switching action acoustically and by sense of touch when contacted. The foils 1, 2, 3, and 4 are fashioned preferably of a plastic material, for instance polyester, while the conducting paths 5 and the contact points 7 consist of an electrically conductive metal, such as silver. Depending on the area of application, more or less foils or laminae may also be provided. The front foil 4 may also be designed with a plane surface without touch domes.

A first variant of a device for the pressure-bonding of foils pursuant to the invention, for instance for the manufacture of a keyboard, is illustrated schematically in FIG. 3. Recognizable is a first plate 10 with a plane surface 11 fastened stationary on supports 12, this plate 10 exhibiting a large number of openings 14 connected with a vacuum pump 13. A foil, for example the base foil 1, can be fixed immovably in every position on the surface 11 by placing the foil on the surface and evacuating the plate 10.

A second plate 20 exhibiting a surface 21 curved towards the first plate 10 is arranged above the surface 11 on a stable assembly 15. When the radius of curvature is, for instance, 4 m, the surface 24 is therefore only slightly curved. The second plate 20 is also provided with openings 16 not shown in the drawing, which are connected by way of a flexible vacuum line 17 with a second pump not visible in the drawing so that a foil can be fixed by suction in a good plane position on the curved surface 21.

The second plate 20 swivels and is connected with two pneumatic or hydraulic pressure cylinders 30 and 40 by means of two axle joints 18 and 19 arranged at a distance from each other. The pressure cylinders 30 and 40 are attached to the assembly 15 and stand vertically to the first plate 10. The pressure cylinders 30 and 40 can also be substituted by mechanical motion elements. The second plate 20 can be adjusted in height and be swiveled infinitely variable by actuating the pressure cylinders 30 and 40. The second plate 20 can be rolled on the first plate 10 and, respectively, on a foil with constant or variable pressure by, for instance, extending the pressure cylinder to the point that the edge area 22 of the second surface 21 rests with the proper pressure on the foil, and by extending subsequently the second cylinder 40 with simultaneous shortening of the cylinder 30. A control device 23 controls the pressure cylinders 30 and 40, as well as the two vacuum pumps.

The rolling motion of the second plate 20 is controlled by means of bolts 50, the latter being fastened in the first plate 10 so as to be retractable in it and engaging respective guide openings 60 in the second plate 20 during the rolling motion. The guidance of the plate 20 permits exact positioning and the precise repeatability of the rolling action. However, other means of guidance, for instance rack and pinnions or locking bands may also be provided.

The device pursuant to the invention can be equipped with means for heating and be used for hot-pressing.

The process for the manufacture of a keyboard is explained hereafter in closer detail by means of FIG. 4 to 8. At first, the base foil 1, which can be bonded to protective foils not shown here, is positioned exactly on the first surface 11 with the conductor paths 5 pointing downward and fixed exactly level and immovably by suction. The second plate 20 is now lowered until the marginal area 22 rests with the proper pressure on a marginal area of the base foil 1 (FIG. 4). The second plate 20 is now rolled on the base foil 1 under constant contact pressure, whereby the pressure force of the first plate 10 is decreased and that of the second plate 20 increased, with the result that the base foil 1 is fixed exactly level and immovably in position on the second plate 20 after a rolling motion (FIG. 5).

The second plate 20 is lifted and the spacer foil 2 positioned and fixed on the first surface 11 is the same position as previously the base foil 1 (FIG. 6). Possible protective foils on the base foil 1 and the spacer foil 2 are pulled off and an adhesive layer 24 is exposed on the spacer foil 2 (FIG. 7). The previously mentioned rolling action is now repeated exactly, causing the base foil 1 to be bonded to the spacer foil 2. The contact foil 3 is now bonded to the spacer foil 2, whereby the motion sequences mentioned previously are repeated. Thanks to the good plane position of the spacer foil 2 and the contact foil 3 no air is pressed out of the openings 6 during the process. For this reason, no equalizing channels are required between the openings 6. A thin cover foil not shown here and exhibiting openings corresponding to the openings 6 can be bonded to the side of the contact foil 3 facing the front foil 4. When the contact foil 3 on the first plate 10 is sucked in, the contact foil 3 arches at the openings of the cover foil towards the first plate 10, so that the distance between the base foil 1 and the contact foil 3 after the bonding is greater in the area of the openings 6 than in the other areas. As a result, the danger of short-circuiting is diminished further. In conclusion, the front foil 4 is bonded to the contact foil 3.

The second variant for the pressure-bonding of foils illustrated in FIGS. 9 and 10 exhibits a rigid machine frame 120 standing on four adjustable dish-shaped feet 273. A scissors-type lift table 250 known per se supports a vacuum plate 100.

The vacuum plate 100 is perforated along a smooth surface 110. The scissors-type lift table 250 is actuated hydraulically and the vacuum plate 100 is adjustable infinitely variable in height.

A slightly curved vacuum plate 200 lies capable of being rolled on straight slide rails 102 which are resting on supports 104. The slide rails 102 are provided with a toothing 101 intermeshing with corresponding teeth of plates 203 fastened rigidly to the side of the curved vacuum plate 200.

A roller 260 with two rigidly attached gears 261 rests capable of being rolled on the Curved vacuum plate 200, whereby the gears 261 mesh with the upper teeth of the lateral plates 203. The roller 260 exhibits two rolls 263 rolling on two straight bars 270 fastened to the supports 262. In addition, the roller 260 exhibits two flanges 264 resting on the upper surface of the curved plate 200 capable of being rolled.

The roller 260 is rotatable about its axis by means of an hydraulic rotary drive 271 known per se. The rotary drive 271 revolves with the roller 260 and is fastened to a slewable lever 272 in a manner not shown here in detail. The roller 260 can also be turned by an electric motor or another suitable drive.

If the roller 260 is rotated by the drive 271, it rolls, depending on the direction of rotation, either forward or backward over the curved plate 200. As a consequence, the plate 200 executes inevitably a positive-locking rolling motion over the entire range of operation.

Two vacuum pumps 130 with control valves 133 adjustable by motor are connected with the lower and upper vacuum plate 100 and 200 respectively, by means of flexible vacuum hoses 131. The two plates 100 and 200 respectively can therefore be evacuated and ventilated independently from each other. The pressures in the plates 100 and 200 respectively are indicated by five light-emitting diodes each not shown in the drawing.

The operating area is accessible by way of an operating opening 121 with lateral light barriers 122.

In addition, the device is equipped with a control mechanism 123, as well as a hydraulic unit not illustrated in the drawing.

The method of operation of the mechanism is to be explained in greater detail by means of the FIG. 11a to 11h.

Figure 11A:
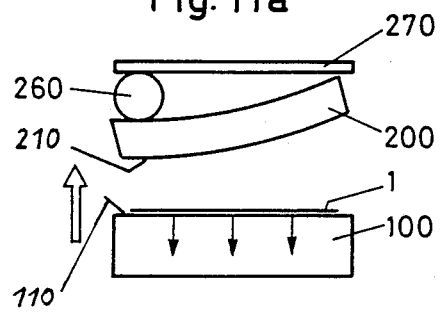
Figure 11B:
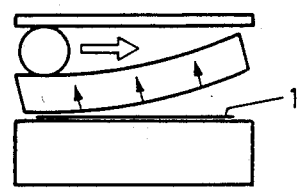
Figure 11C:
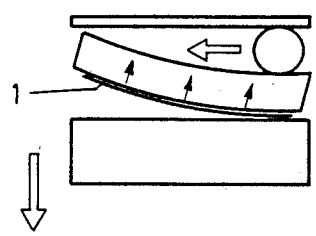
Figure 11D:
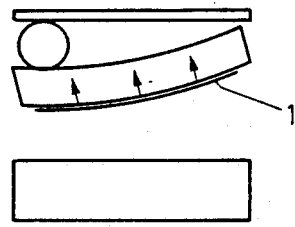
Figure 11E:
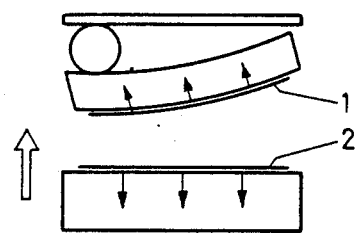
Figure 11F:
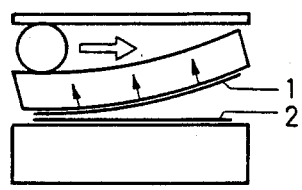

A foil 1 is inserted through the operating opening 121 by the operator or an automatic feed device and, as shown in FIG. 11a, positioned on the lower vacuum plate 100 and held in place there by suction. The lower vacuum plate is now elevated by the scissors-type lift table 250 until the foil 1, as shown in FIG. 11b, touches the upper vacuum plate. The upper plate 200 is now evacuated and rolled over on the lower plate 100 and the foil 1 respectively, with a simultaneous increase of the pressure in the plate 100. As soon as the foil 1 abuts completely on the upper plate 200, the lower plate 100 is lowered and the upper plate 200 is moved into the starting position, so that the state shown in FIG. 11d is attained. A second foil 2 is now inserted and fixed in position on the lower plate 100, following that the lower plate 100 is raised. The upper plate 200 is rolled over on the lower foil 2 with the proper pressure and the pressure in the lower plate simultaneously increased.

Figure 11G:
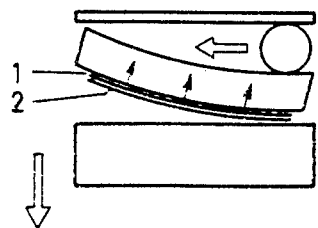
Figure 11H:
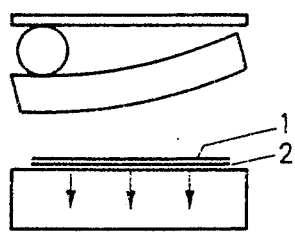

The foil 2 is now completely pressure-bonded with the foil 1. (FIG. 11g). The upper plate 200 is now moved into the starting position, whereby the lower plate 100 is evacuated at the same time and the pressure in the upper plate 200 is increased. The pressure in the lower plate 100 is now increased and the two laminated foils are lifted off so that a new work cycle can begin. It is a matter of course that also more than two foils can be pressure-bonded according to this process.

I claim:

1. A process for pressure-bonding flexible foils to form a multi-layer composite, comprising:
   detachably fastening a first foil layer to a first surface along one side thereof using vacuum pressure;
   transferring the first foil layer from the first surface to a second opposed cooperating curved surface including vacuum pressure means using a rolling motion of the second surface over the first surface by reducing the vacuum pressure fastening the first foil layer to the first surface and increasing the vacuum pressure of the second surface simultaneously so that the first foil is detached from the first surface and becomes detachably fastened to the second surface, the first and second surfaces including guide means for cooperating with each other;

detachably fastening a second foil layer to the first surface along one side thereof using vacuum pressure in the same position as the first foil;

rolling the second surface and first foil attached thereto across the first surface while applying uniform contact pressure between the first and second foil layers and engaging the guide means so that a multi-layer composite of the first and second foil layers is formed and simultaneously releasing the second foil layer from the first surface to attach the composite of the first and second foil layers to the second surface; and removing the composite from the second surface.

2. The process of claim 1, wherein the steps of detachably fastening a third foil layer to the first surface and attaching the third foil layer onto the foil layer or composite on the second surface are repeated multiple times using different foils layers in each repeated step to pressure bond various foils together to form a multilayer composite composed of more than two foil layers.

3. The process of claim 1, wherein the steps of detachably fastening a foil layer to the first surface and attaching the foil layer onto the foil layer on the second surface are repeated three times using different foil layers in each repeated step to attach various foils together to form a four layer composite.

4. The process of claim 3, wherein the first foil is a base foil, the second foil is a spacer foil, the third foil is a contact foil and the fourth foil is a front foil.

5. A device for pressure-bonding flexible foil layers to form flexible composite sheets, comprising:

a frame;

a first vacuum plate having a substantially planar surface for releaseably holding a flexible foil layer on the planar surface mounted on the frame;

a second opposed cooperating vacuum plate having a lower convex surface opposed to the first vacuum plate for releasably holding a flexible foil on the convex surface and being movably mounted on the frame opposite the first plate so that the lower convex surface is rollable across the planar surface of the first plate and applies uniform pressure to the foil layers therebetween;

the first vacuum plate and second vacuum plate cooperating so that the vacuum pressure can be reduced at the same time the vacuum pressure is increased in the second surface when contact pressure between the plates is applied; and motion control means for imparting a rolling motion of the second plate across the first plate and maintaining uniform contact pressure between the plates and against the foil layers therebetween whereby encapsulation of aid between the foil layers is prevented.

6. The device of claim 5, wherein the frame secures the first plate and the second plate to prevent lateral movement of the second plate with respect to the first plate.

7. The device of claim 5, wherein the second vacuum plate has an upper concave surface substantially parallel to the convex surface and wherein the motion control means includes at least one bar mounted above the concave surface of the second plate and at least one roller between the concave surface and the bar to transmit a uniform pressure against the second plate as the second plate is rolled across the first plate to compress the convex surface of the second plate against a flexible foil maintained on the first plate.

8. The device of claim 5, wherein the first vacuum plate is supported on a lift table.

9. The device of claim 8, wherein the lift table is a scissors-type lift table.

10. The device of claim 9, wherein the scissors-type lift table is hydraulically activated.

* * * * *